United States Patent
Klomp et al.

(10) Patent No.: US 9,939,737 B2
(45) Date of Patent: Apr. 10, 2018

(54) ELECTROSTATIC CLAMP

(71) Applicant: ASML Netherlands B.V., Veldhoven (NL)

(72) Inventors: Petrus Augustinus Franciscus Klomp, Veldhoven (NL); Bastiaan Matthias Mertens, Veldhoven (NL); Arnoud Willem Notenboom, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 32 days.

(21) Appl. No.: 14/761,957

(22) PCT Filed: Dec. 5, 2013

(86) PCT No.: PCT/EP2013/075619
§ 371 (c)(1),
(2) Date: Jul. 20, 2015

(87) PCT Pub. No.: WO2014/114395
PCT Pub. Date: Jul. 31, 2014

(65) Prior Publication Data
US 2015/0370178 A1  Dec. 24, 2015

Related U.S. Application Data

(60) Provisional application No. 61/755,088, filed on Jan. 22, 2013.

(51) Int. Cl.
*G03F 7/20* (2006.01)
*H01L 21/683* (2006.01)
(Continued)

(52) U.S. Cl.
CPC ...... *G03F 7/70708* (2013.01); *H01L 21/6831* (2013.01); *H01L 21/6833* (2013.01); *H01L 21/6875* (2013.01); *H02N 13/00* (2013.01)

(58) Field of Classification Search
CPC ............. G03F 7/70708; H01L 21/6831; H01L 21/6833; H01L 21/6875; H02N 13/00
See application file for complete search history.

(56) References Cited

U.S. PATENT DOCUMENTS

| | | | |
|---|---|---|---|
| 5,530,616 A | 6/1996 | Kitabayashi et al. | |
| 5,668,524 A * | 9/1997 | Aida ...................... | H01C 1/012 279/128 |

(Continued)

FOREIGN PATENT DOCUMENTS

| | | |
|---|---|---|
| CN | 1977144 | 6/2007 |
| JP | S62-157752 A | 7/1987 |

(Continued)

OTHER PUBLICATIONS

International Search Report directed to related International Patent Application No. PCT/EP2013/075619, dated May 16, 2014; 5 pages.

(Continued)

*Primary Examiner* — Michelle M Iacoletti
(74) *Attorney, Agent, or Firm* — Sterne, Kessler, Goldstein & Fox P.L.L.C.

(57) ABSTRACT

An electrostatic clamp (12) comprising an electrode (2), a layer of resistive material (6) located on the electrode, and a layer of dielectric (8) located on the resistive material, wherein the electrostatic clamp further comprises burls (10) which project from the layer of dielectric.

25 Claims, 6 Drawing Sheets

(51) Int. Cl.
    *H01L 21/687*    (2006.01)
    *H02N 13/00*     (2006.01)

(56)  References Cited

U.S. PATENT DOCUMENTS

| | | | |
|---|---|---|---|
| 6,891,237 B1* | 5/2005 | Bao | H01L 51/0516 |
| | | | 257/410 |
| 8,861,170 B2* | 10/2014 | Lin | H02N 13/00 |
| | | | 361/234 |
| 2005/0183669 A1 | 8/2005 | Parkhe et al. | |
| 2007/0217117 A1 | 9/2007 | Ohta et al. | |
| 2007/0253139 A1* | 11/2007 | Nakano | B32B 15/08 |
| | | | 361/234 |
| 2009/0284894 A1* | 11/2009 | Cooke | H01L 21/6831 |
| | | | 361/234 |
| 2012/0044609 A1 | 2/2012 | Cooke et al. | |
| 2012/0154985 A1* | 6/2012 | Kato | H01G 9/02 |
| | | | 361/523 |
| 2012/0307412 A1 | 12/2012 | Boyd, Jr. et al. | |
| 2013/0120897 A1 | 5/2013 | Lin et al. | |
| 2014/0002805 A1* | 1/2014 | Banine | G03F 7/70691 |
| | | | 355/72 |
| 2014/0368804 A1* | 12/2014 | Lafarre | G03F 7/70416 |
| | | | 355/72 |
| 2015/0103325 A1 | 4/2015 | Van Der Wilk et al. | |

FOREIGN PATENT DOCUMENTS

| | | |
|---|---|---|
| JP | H07-153825 A | 6/1995 |
| JP | 2003-163260 A | 6/2003 |
| JP | 2006-287210 A | 10/2006 |
| JP | 2009-200393 A | 9/2009 |
| KR | 10-0997374 B1 | 11/2010 |
| WO | WO 03032038 | 4/2003 |

OTHER PUBLICATIONS

International Preliminary Report on Patentability Report on Patentability and Written Opinion of the International Searching Authority directed to related International Patent Application No. PCT/EP2013/075619, dated Jul. 28, 2015; 7 pages.

* cited by examiner

ELECTROSTATIC CLAMP

CROSS-REFERENCE TO RELATED APPLICATIONS

This application claims the benefit of U.S. provisional application 61/755,088, which was filed on 22 Jan. 2013, and which is incorporated herein in its entirety by reference.

BACKGROUND

Field of Invention

The present invention relates to an electrostatic clamp and to a method of making an electrostatic clamp. The electrostatic clamp may form part of a lithographic apparatus.

Background Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction. It is also possible to transfer the pattern from the patterning device to the substrate by imprinting the pattern onto the substrate.

Electrostatic clamps may be used in lithographic apparatus in which it is not practical to use a vacuum clamp. For example, some regions of a EUV lithographic apparatus operate under vacuum conditions, and consequently it may not be practical to use a vacuum clamp in those regions. An electrostatic clamp may be used instead. An electrostatic clamp may be provided to electrostatically clamp (i.e., hold) an object, such as a mask or a substrate (wafer) to an object support, such as a mask table or a wafer table, respectively. Such a clamp may be described as an object holder. Alternatively and/or additionally, the clamp may form part of an object holder. The object holder might sometimes be described, alternatively and/or additionally, as an object support.

It is desirable to provide, for example, an improved electrostatic clamp which obviates or mitigates one or more of the problems of the prior art, whether identified herein or elsewhere.

SUMMARY

According to a first an aspect of the invention there is provided an electrostatic clamp comprising an electrode, a layer of resistive material located on the electrode, and a layer of dielectric located on the resistive material, wherein the electrostatic clamp further comprises burls which project from the layer of dielectric.

The burls may be formed from dielectric. The burls may be formed from an insulator that is not a dielectric.

The burls and the layer of dielectric material may both be formed from the same dielectric.

The burls may be formed from a dielectric which is different from the dielectric used to form the layer of dielectric.

A surface of the resistive material on which the layer of dielectric is provided may be smooth.

A surface of the resistive material on which the layer of dielectric is provided may be polished.

The burls may be formed from diamond-like carbon.

The layer of dielectric and the burls may both be formed from diamond-like carbon.

According to a second aspect of the invention there is provided an electrostatic clamp comprising an electrode, and a layer of dielectric located on the electrode, wherein the electrostatic clamp further comprises burls which project from the layer of dielectric.

The burls may be formed from dielectric. The burls may be formed from an insulator that is not a dielectric.

The burls and the layer of dielectric material may both be formed from the same dielectric.

The burls may be formed from a dielectric which is different from the dielectric used to form the layer of dielectric.

A surface of the electrode on which the layer of dielectric is provided may be smooth.

A surface of the electrode on which the layer of dielectric is provided may be polished.

The burls may be formed from diamond-like carbon.

The layer of dielectric and the burls may both be formed from diamond-like carbon.

The burls and the layer of dielectric material may both be formed from the same dielectric.

According to a third aspect of the invention there is provided a method of making an electrostatic clamp comprising:

providing a layer of resistive material on top of an electrode;

providing a layer of dielectric on top of the layer of resistive material;

removing some of the dielectric to form burls which project from the layer of dielectric.

A surface of the layer of resistive material upon which the layer of dielectric is provided may be smooth.

A surface of the layer of resistive material upon which the layer of dielectric is provided may be polished.

According to a fourth aspect of the invention there is provided a method of making an electrostatic clamp comprising:

providing a layer of resistive material on top of an electrode;

providing a layer of dielectric on top of the layer of resistive material;

forming burls on top of the layer of dielectric.

The burls may be formed from dielectric. The burls may be formed from an insulator that is not a dielectric.

The burls and the layer of dielectric may both be formed using the same dielectric.

A surface of the layer of resistive material upon which the layer of dielectric is provided may be smooth.

A surface of the layer of resistive material upon which the layer of dielectric is provided may be polished.

The methods of the third and fourth aspects of the invention may be arranged to provide an electrostatic clamp having any suitable feature mentioned further above in relation to the first aspect of the invention.

According to a fifth aspect of the invention there is provided a method of making an electrostatic clamp comprising:

providing a layer of dielectric on top of an electrode;
removing some of the dielectric to form burls which project from the layer of dielectric material.

A surface of the electrode on which the layer of dielectric is provided may be smooth.

A surface of the electrode on which the layer of dielectric is provided may be polished.

According to a sixth aspect of the invention there is provided a method of making an electrostatic clamp comprising:

providing a layer of dielectric on top of an electrode;
forming burls on top of the layer of dielectric material.

A surface of the electrode on which the layer of dielectric is provided may be smooth.

A surface of the electrode on which the layer of dielectric is provided may be polished.

The methods of the fifth and sixth aspects of the invention may be arranged to provide an electrostatic clamp having any suitable feature mentioned further above in relation to the second aspect of the invention.

According to a further aspect of the invention, there is provided a lithographic apparatus comprising the clamp of the first or second aspects of the invention. According to a further aspect of the invention, there is provided a lithographic apparatus comprising a clamp made according to any of the third to sixth aspects of the invention.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. One or more aspects of the invention may, where appropriate to one skilled in the art, be combined with any one or more other aspects described herein, and/or with any one or more features described herein.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
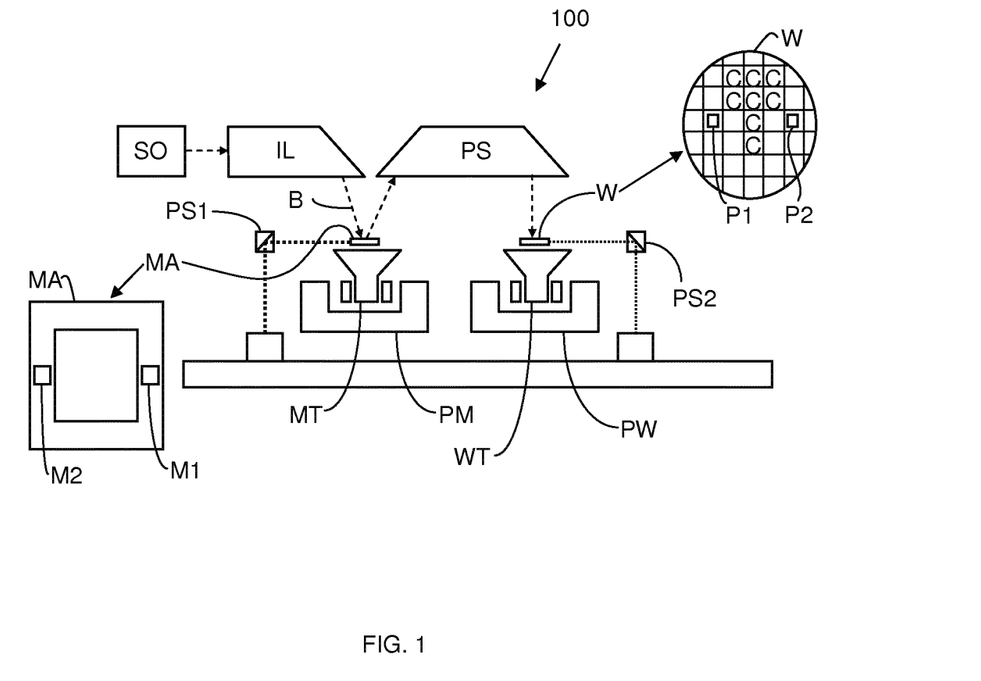
FIG. 1 schematically depicts a lithographic apparatus according to an embodiment of the invention.

FIG. 1 schematically depicts a lithographic apparatus 100 including a source collector apparatus SO according to one embodiment of the invention. The apparatus comprises:

an illumination system (illuminator) IL conFigured to condition a radiation beam B (e.g., EUV radiation).

a support structure (e.g., a mask table) MT constructed to support a patterning device (e.g., a mask or a reticle) MA and connected to a first positioner PM conFigured to accurately position the patterning device;

a substrate table (e.g., a wafer table) WT constructed to hold a substrate (e.g., a resist-coated wafer) W and connected to a second positioner PW conFigured to accurately position the substrate; and a projection system (e.g., a reflective projection system) PS conFigured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much EUV radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector apparatus SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector apparatus SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector apparatus. The laser and the source collector apparatus may be separate entities, for example when a CO2 laser is used to provide the laser beam for fuel excitation.

In such cases, the laser is not considered to form part of the lithographic apparatus and the laser beam is passed from the laser to the source collector apparatus with the aid of a beam delivery system comprising, for example, suitable directing mirrors and/or a beam expander.

In an alternative method, often termed discharge produced plasma ("DPP") the EUV emitting plasma is produced by using an electrical discharge to vaporise a fuel. The fuel may be an element such as xenon, lithium or tin which has one or more emission lines in the EUV range. The electrical discharge may be generated by a power supply which may form part of the source collector apparatus or may be a separate entity that is connected via an electrical connection to the source collector apparatus.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
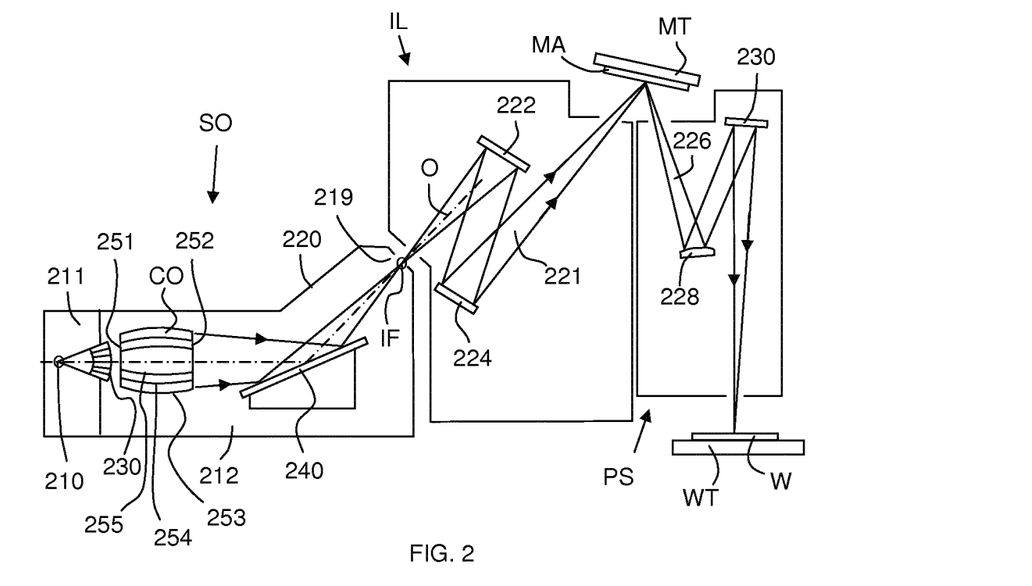
FIG. 2 is a more detailed schematic view of the lithographic apparatus.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
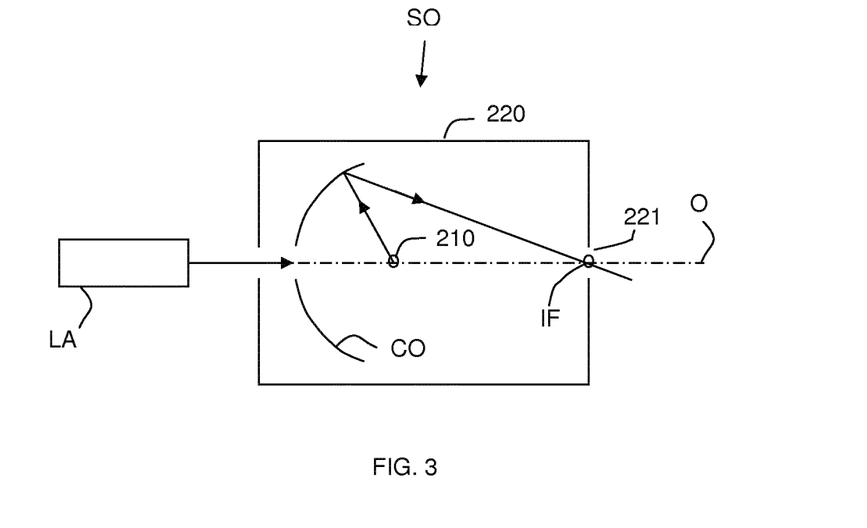
FIG. 3 is a more detailed schematic view of the source collector apparatus SO of the apparatus of FIGS. 1 and 2.

Alternatively, the source collector apparatus SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

FIG. 4 schematically illustrates a method of fabricating an electrostatic clamp according to an embodiment of the invention. Referring first to FIG. 4A, an electrode 2 is sandwiched between two layers of resistive material 4, 6. In an alternative arrangement (not illustrated) the lower layer 4 may be formed from a different material to the upper layer 6. The lower layer 4 may for example be formed from an insulator. The lower layer 4 acts as a base for the electrostatic clamp, and may be significantly thicker than the upper layer 6.

Figure 4A:
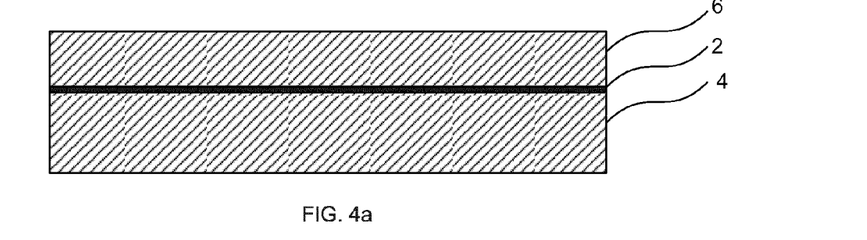
FIGS. 4A-4D schematically show in cross-section a method of making an electrostatic clamp according to an embodiment of the invention.

The upper layer of resistive material 6 may for example have a thickness of around 100 microns or more. The upper layer of resistive material 6 may for example have a thickness of around 2 mm or less. The volume resistivity of the resistive material 6 may for example lie in the range $10^7$ $\Omega$-m to $10^9$ $\Omega$-m (measured at room temperature). The upper layer of the resistive material 6 may for example be formed from ceramic. It may for example be formed by sintering sheets of ceramic together in order to form ceramic layers having a desired thicknesses. The resistive material may for example be aluminium nitride (AlN), or any other suitable material. Polishing may be used to provide an upper surface of the resistive material 6 with a desired smoothness (and may also be used to reduce the thickness of the resistive material to a desired thickness). Any suitable method may be used to provide the upper surface of the resistive material 6 with a desired smoothness.

Figure 4B:
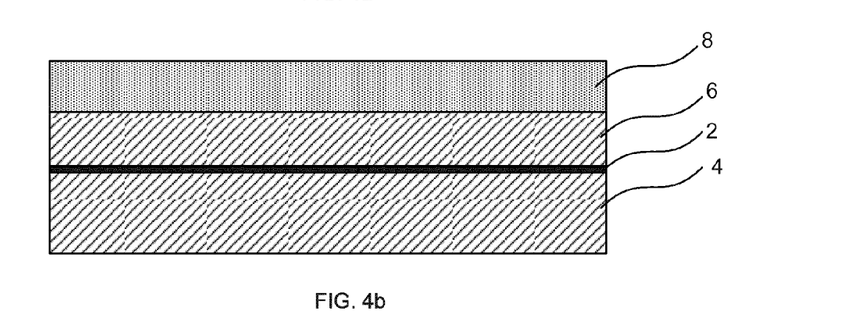

Referring to FIG. 4B, a layer of dielectric 8 is provided on top of the upper portion of resistive material 6. The dielectric 8 may for example be diamond-like carbon (DLC), quartz, or may be some other suitable material. The dielectric 8 may for example have a thickness of around 2 microns or more. A minimum thickness of the dielectric may depend upon the voltage which is to be applied to the electrode in use; the thickness being sufficient to prevent breakdown at that voltage. The dielectric 8 may for example have a thickness of a few tens of microns or less (e.g., less than 100 microns). The dielectric 8 may have a tendency to peel away from the resistive material 6 if it is too thick. In an embodiment, the dielectric 8 may have a thickness of around 20 microns.

The layer of dielectric 8 may for example be deposited onto the resistive material 6 using physical vapor deposition, chemical vapor deposition, or any other suitable process.

The method used to form the dielectric layer 8 may provide the dielectric layer 8 with a smooth upper surface. This may be through use of a method which inherently provides a smooth upper surface, or may be through use of a method which provides a rough upper surface, which is then polished.

Figure 4C:
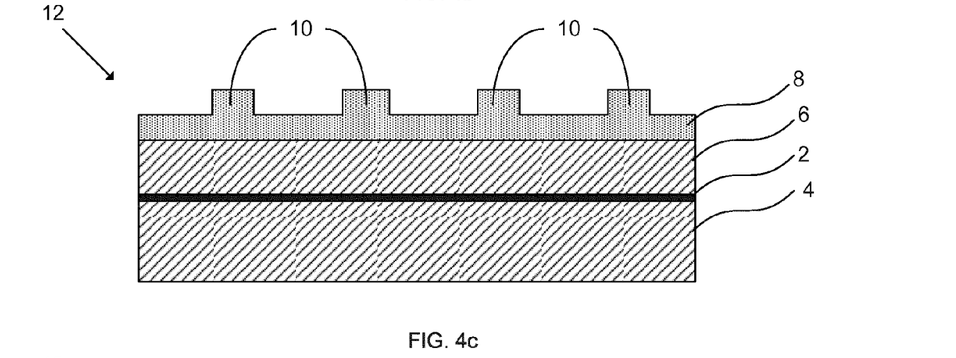

Referring to FIG. 4C, portions of the dielectric layer 8 are partially removed in order to form burls 10. Removal of the portions of the dielectric layer 8 may be via any suitable process. Etching (e.g., wet etching using acid) may for example be used. A form of dry etching such as blasting (e.g., using sand or powder) may for example be used.

Taking etching as an example, this may be achieved by providing a mask on top of the dielectric layer 8, the mask being closed at locations where burls are desired, and being open at locations where it is desired to remove dielectric. Etching is then performed such that areas which are beneath the closed portions of the mask are not etched and areas which are beneath open portions of the mask are etched. In this way a desired amount of dielectric is removed from desired locations, and burls are formed with a desired spatial arrangement. The mask is then removed, leaving behind the structure shown in FIG. 4C. The burls 10 may have smooth upper surfaces. Alternatively, the burls 10 may be polished to provide upper surfaces with a desired smoothness. Any suitable method may be used to provide upper surfaces of the burls 10 with a desired smoothness.

The etching may for example be performed for a period of time which is sufficient to remove around 10 microns of the dielectric layer 8, thereby forming burls with a height of around 10 microns (assuming an initial dielectric layer thickness of 20 microns). The burls may be formed with any desired height, which may for example be in the range 5-20 microns.

The resulting structure shown in FIG. 4C may be used as an electrostatic clamp 12. In use, a voltage is applied to the electrode 2 (e.g., of the order of kV). When the voltage is applied, current flows through the resistive material 6 and electrons thus travel to the interface between the resistive material and the dielectric layer 8. After a time which is determined by the RC time constant of the electrostatic clamp 12, the voltage at the upper surface of the resistive material 6 will be substantially the same as the voltage applied to the electrode 2. Coulomb force will attract a substrate (not shown) to the electrostatic clamp 12, thereby holding it in place. The Coulomb force may be sufficiently strong that it crushes contamination particles between the substrate and the electrostatic clamp 12.

The electrostatic clamp may for example be used to hold wafers during exposure in a lithography apparatus (e.g., of the type shown in FIGS. 1 and 2). Where this is the case, the voltage is initially not applied to the electrode 2. A wafer (not shown) is positioned on the electrostatic clamp and the voltage is then applied to the electrode 2. The electrical field generated by the electrode attracts the wafer and holds it in place during exposure of the wafer. The voltage is then removed from the electrode 2, thereby removing the electrical field such that the wafer is no longer held in place on the electrostatic clamp. The wafer is then removed and replaced with another wafer.

An advantage of the electrostatic clamp 12 of the illustrated embodiment of the invention is that, because the dielectric layer 8 has been provided on top of a smooth surface of the resistive material 6, it is more likely to be a fully closed layer than would be the case if it had been provided on a rough surface. If the dielectric layer 8 were to be provided on a rough surface of resistive material then, because the dielectric layer is relatively thin, there may be locations at which peaks of the resistive material project through the dielectric. In such a case the dielectric layer is not fully closed but instead includes openings, which may be referred to as pinholes. These pinholes would provide unwanted conductive paths. This could lead to unwanted transfer of charge to wafers (or other substrates) held by the electrostatic clamp. Alternatively, in an embodiment in which a conductor is provided on the electrostatic clamp 12 (described further below), a conductive path may provide a leak current to that conductor which reduces the local electric field and hence reduces the local clamping pressure.

A further advantage which arises from forming the dielectric layer 8 on top of a smooth surface of the resistive material 6 is that sharp peaks in the resistive material are not present. Sharp peaks may generate undesirable locally large electric fields.

If, instead of using a method according to the invention, the burls had been formed in the resistive material 6 with a dielectric layer being provided on top of the resistive material after burl formation, this would have given rise to the problems mentioned above. Formation of the burls via blasting would have given the resistive material between the burls a rough upper surface (the upper surface of the burls would remain smooth because it is masked). It may not be practically possible to polish effectively surfaces between burls. Thus, the dielectric layer provided between the burls would be likely to include pinholes. In addition, peaks in the resistive material would give rise to undesirable locally large electric fields.

These problems are avoided by the illustrated embodiment of the invention (and other embodiments described below) because the burls are formed using the dielectric material, thereby avoiding the need to use blasting and instead allowing the dielectric to be provided on a smooth surface.

Figure 4D:
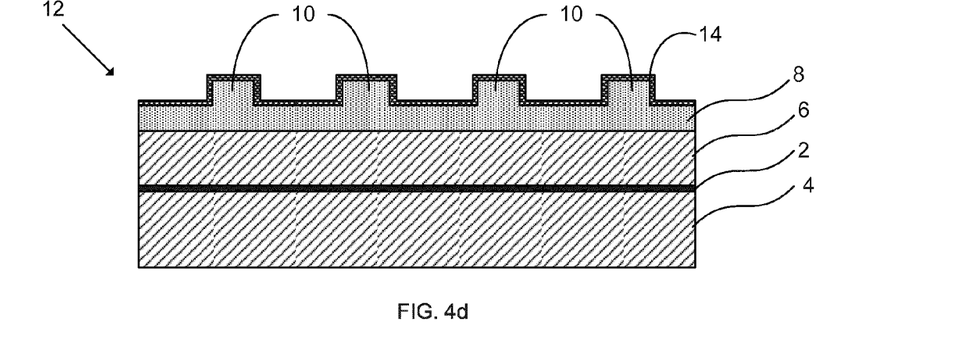
Figure 5:
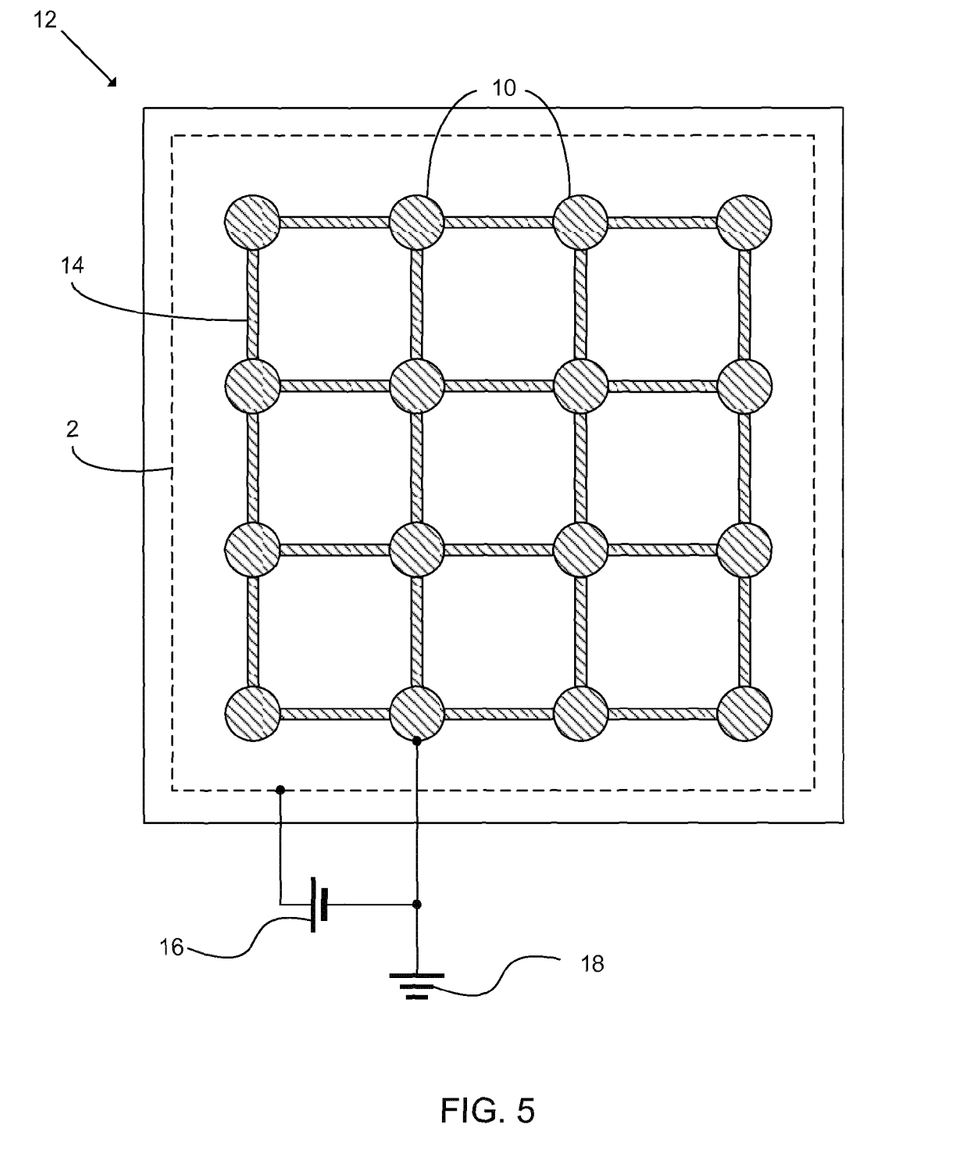
FIG. 5 schematically shows viewed from above the electrostatic clamp made using the method shown in claim 4.

In an embodiment, conductive material 14 may be provided on top of the burls and may extend between the burls as shown schematically in FIG. 4D and FIG. 5 (e.g., in a grid-like arrangement). The conductive material 12 may for example be a metal nitride or some other suitable conductor. FIG. 5 shows schematically the electrostatic clamp 12 as viewed from above. As may be seen from FIG. 5, the conductive material 14 is provided on top of the burls 10, and in addition extends between the burls 10. FIG. 5 also shows a voltage source 16 connected to the electrode 2. The conductive material 14 prevents the build up of charge on the burls 10, since any charge which is received on the burls passes along the conductive material 12 to ground 18. This prevents localised sticking of a wafer (or other substrate) to the electrostatic clamp 12 when no voltage is applied to the electrode 2. Such localised sticking is undesirable because it prevents a wafer from fully relaxing when it is placed on the electrostatic clamp 12 (before the voltage is applied to the electrode), and therefore causes distortion of the wafer. Such distortion may reduce the accuracy with which a pattern can be projected onto the wafer by a lithographic apparatus.

An advantage of the electrostatic clamp shown in FIG. 4D and FIG. 5 is that the conductive material 14 is only in contact with one material, i.e., the dielectric. This advantage arises because the burls 10 and the dielectric layer 8 are both formed from the same dielectric. If the burls had been formed for example from the resistive material, with dielectric being provided between the burls but not provided on the burls, then the conductive material would be in contact with the resistive material and the dielectric. At points where the conductor, resistive material and dielectric met, differences of the coefficient of thermal expansion between those materials could cause breaks in the connections between the materials (e.g., during cooling from a high temperature which may be required as part of the electrostatic clamp fabrication process). Breaks in the conductive material 14 could for example isolate a burl such that charge could become trapped on that burl and cause unwanted localised sticking of a wafer (or other substrate) to the burl. That is, breaks in the conductive material 14 could prevent it from operating effectively to prevent charge build-up.

The method of fabricating the electrostatic clamp described above uses less steps than may be required by at least one known method, and is therefore cheaper and easier to implement.

FIGS. 4 and 5 are merely schematically illustrations of the electrostatic clamp 12. In practice electrostatic clamp 12 may have a different shape (e.g., substantially circular) and may include a larger number of burls 10. The electrostatic clamp 12 may include more than one electrode.

An alternative method of fabricating the electrostatic clamp is shown schematically in FIG. 6. The method is similar to the method illustrated in FIG. 4, and reference numerals which correspond with those in FIG. 4 are used for corresponding features of the electrostatic clamp.

Figure 6A:
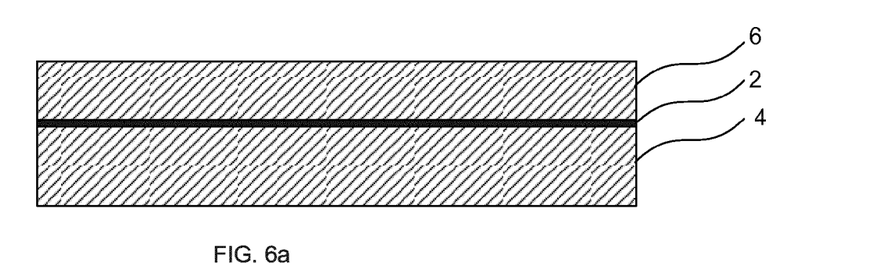
FIGS. 6A-6D schematically show in cross-section an alternative method of making an electrostatic clamp according to an embodiment of the invention.

Referring to FIG. 6A, an electrode 2 is sandwiched between two layers of resistive material 4, 6. As explained further above in relation to FIG. 4, the lower layer 4 may be formed from a different material to the upper layer 6. The lower layer 4 may for example be formed from an insulator. An upper surface of the upper layer of resistive material 6 has a smooth surface (it may have been polished to provide a smooth surface). The upper layer of resistive material 6 may have the same properties as described further above in relation to FIG. 4.

Figure 6B:
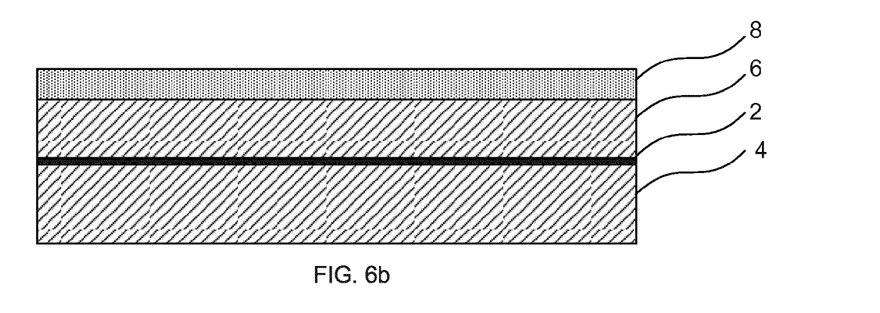

Referring to FIG. 6B, a layer of dielectric 8 is provided on top of the resistive layer. The dielectric 8 may for example be diamond-like carbon (DLC), or may be some other suitable material. As explained below, burls formed from a different material may be provided on top of the layer of dielectric 8, and may be formed from a different material. For this reason, the dielectric will be subjected to less wear, and thus may be less hard than the dielectric used for the embodiment described further above. The dielectric could for example be quartz, or any other suitable material.

The layer of dielectric 8 may for example be deposited onto the resistive material 6 using physical vapor deposition, chemical vapor deposition, or any other suitable process. The layer of dielectric 8 may for example have a thickness of around 2 microns or more. The layer of dielectric 8 may for example have a thickness of a few tens of microns or less (e.g., less than 100 microns). In an embodiment, the layer of dielectric may have a thickness of around 10 microns. Since the layer of dielectric 8 is provided on a smooth surface of the resistive material 6, it does not suffer from pinholes or other problems which may be caused by providing the dielectric on a rough surface (as explained further above).

Figure 6C:
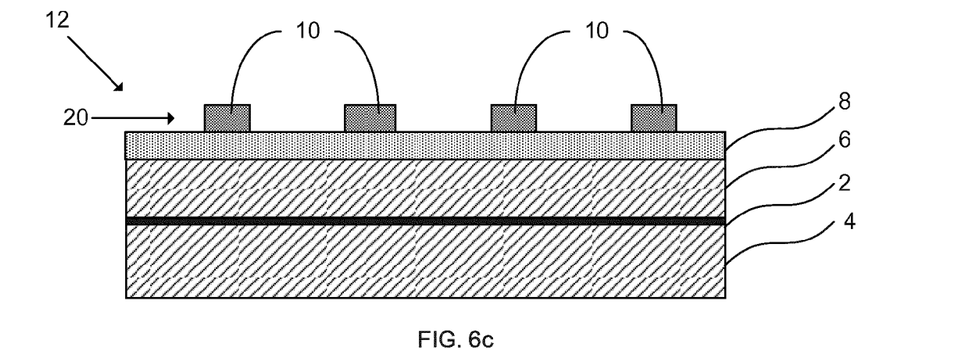

Referring to FIG. 6C, additional dielectric 20 is provided at selected locations on top of the layer of dielectric 8, the additional dielectric being arranged to form burls 10. The additional dielectric 20 may for example be provided at the selected locations using a mask (not shown). The mask is positioned on top of the dielectric, the mask being open at locations where burls are desired and being closed at locations where burls are not desired. The additional dielectric 20 is then provided, for example using physical vapor deposition, chemical vapor deposition, or any other suitable process. The additional dielectric 20 may for example be provided with a thickness of between 5 and 20 microns (e.g., a thickness of around 10 microns). The mask is then removed, leaving behind an electrostatic clamp 12 having the structure shown in FIG. 6C, i.e., burls 10 formed from the additional dielectric 20 which are located on top of the layer of dielectric 8. The burls 10 may have smooth upper surfaces. Alternatively, the burls 10 may be polished to provide upper surfaces with a desired smoothness. Any suitable method may be used to provide upper surfaces of the burls 10 with a desired smoothness.

The burls 10 and the dielectric layer 8 may be formed from different dielectrics. For example, the dielectric layer 8 may be formed from quartz and the burls 10 may be formed from DLC. Alternatively, the burls 10 and the dielectric layer 8 may be formed from the same material. This avoids an interface between two different materials occurring between the burls 10 and the dielectric layer 8 (and may therefore provide greater strength).

The burls 10 may be formed from a material which is not dielectric (only the dielectric layer 8 needs to be formed from dielectric). The burls 10 may be formed from any suitable material, for example any suitable material which can be deposited onto a dielectric. The material used to form the burls 10 may for example be an insulator which is not a dielectric. As explained elsewhere, it may be desirable to form the burls 10 from a hard material because they will be subjected to wear during use. The burls 10 may for example be formed from SiSiC or SiC.

Figure 6D:
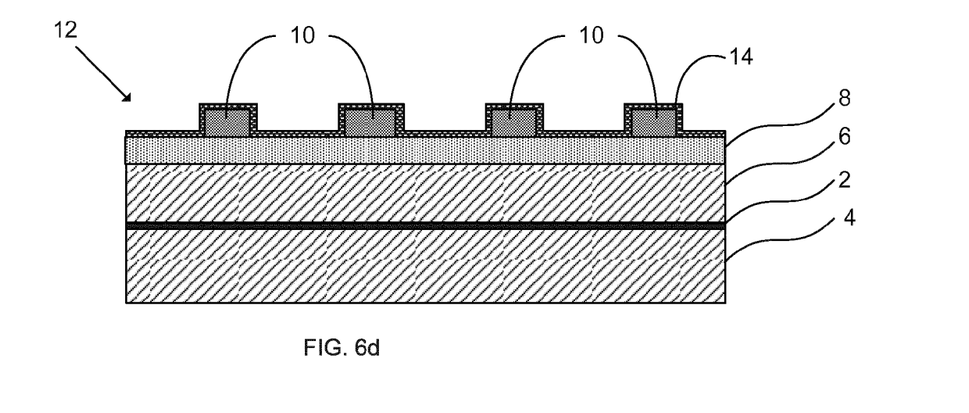

Referring to FIG. 6D, the electrostatic clamp 12 may be provided with conductive material 14 which is located on top of the burls 10 and extends between the burls (e.g., in a grid-like arrangement). The conductive material 12 may for example be a metal nitride. The conductive material 14 is connected to ground (not illustrated), and prevents buildup of charge on the burls.

In an embodiment, the starting point for the methods described above may for example be a Johnsen-Rahbek electrostatic clamp. That is, the apparatus depicted in FIG. 4A or FIG. 6A may be a Johnsen-Rahbek electrostatic clamp. Providing dielectric on top of the resistive material in the manner described and illustrated may be considered to change the clamp from being a Johnsen-Rahbek electrostatic clamp to a hybrid electrostatic clamp, since a conductive path between the electrode and a wafer (or other substrate) being clamped no longer exists.

In an alternative method, an embodiment of the invention may be used to fabricate a coulombic electrostatic clamp. The term "coulombic electrostatic clamp" may be interpreted as meaning a clamp which does not have a layer of resistive material between an electrode and a substrate receiving surface. An example of this method is shown in FIG. 7.

Figure 7A:
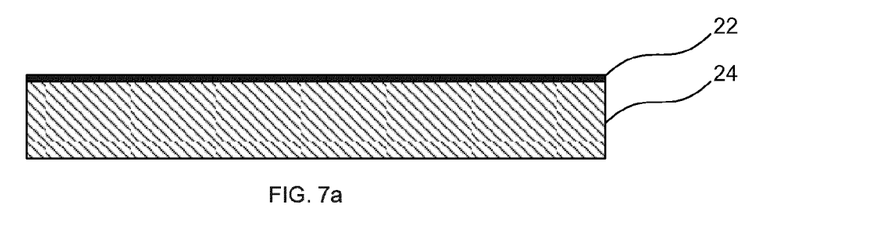
FIGS. 7A-7D schematically show in cross-section a further alternative method of making an electrostatic clamp according to an embodiment of the invention.

Referring first to FIG. 7A, an electrode 22 is provided on a substrate of insulative material 24. The insulative material may for example be glass, SiC or any other suitable material. An upper surface of the insulative material 24 may be polished in order to provide a desired smoothness (i.e., before the electrode 22 is applied). The surface of the electrode 22 may be polished in order to provide a desired smoothness.

Figure 7B:
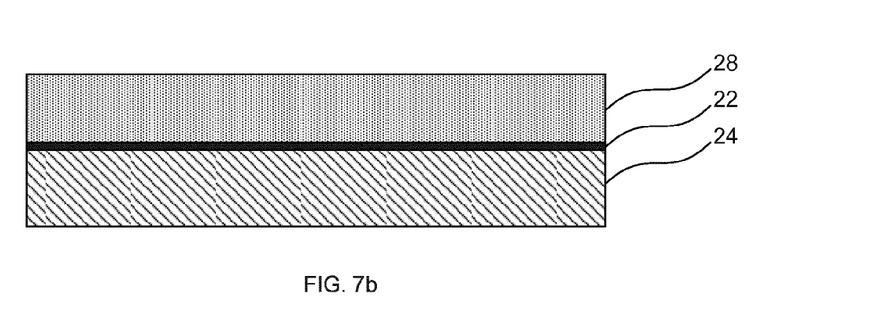

Referring to FIG. 7B, a layer of dielectric 28 is provided on top of the electrode. The dielectric 28 may for example be provided using physical vapor deposition, chemical vapor deposition, or another suitable method. The dielectric 28 may for example be diamond-like carbon (DLC), quartz, or may be some other suitable material. The layer of dielectric 28 may for example have a thickness of around 2 microns or more. The layer of dielectric 28 may for example have a thickness of a few tens of microns or less (e.g., less than 100 microns). In an embodiment, the layer of dielectric 28 may have a thickness of around 20 microns.

Because the layer of dielectric 28 is provided on a smooth surface, it is unlikely to include pinholes or suffer from other problems associated with providing a relatively thin layer on a rough surface.

Figure 7C:
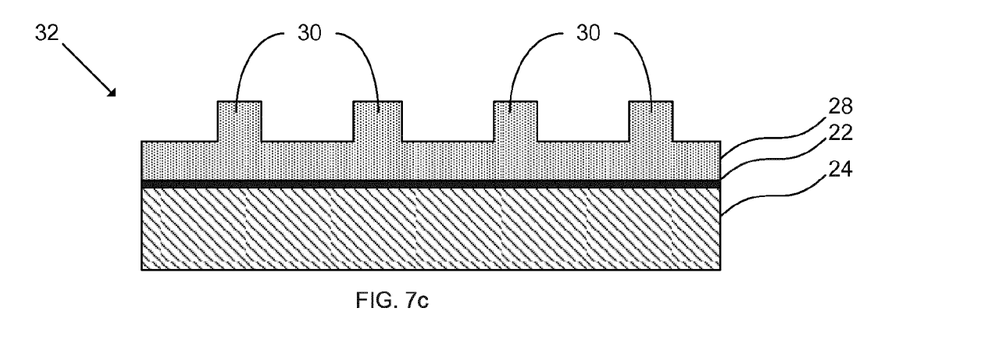

Referring to FIG. 7C, some of the dielectric 28 is removed in order to form burls 30. This may be via etching, blasting, or any other suitable process (e.g., in the manner described further above in relation to FIG. 4). This provides an electrostatic clamp 32 which may be used to clamp wafers or other substrates. The electrostatic clamp shown in FIG. 7C provides the same advantages discussed above in relation to other embodiments.

Figure 7D:
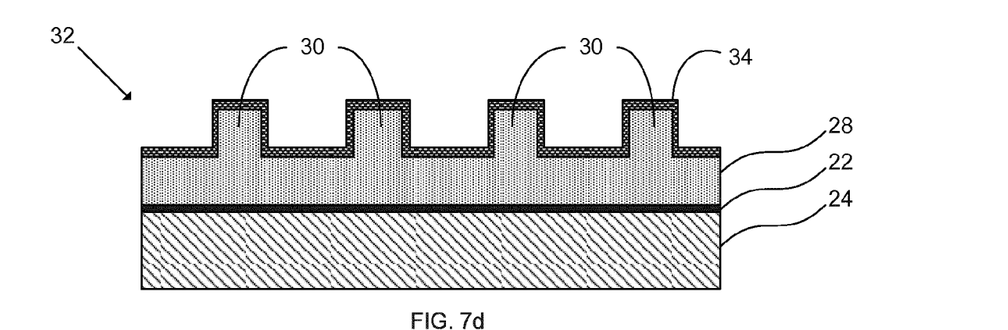

Referring to FIG. 7D, conductive material 34 may be provided on top of the burls 30 and may connect the burls together, for example in the manner shown in FIG. 5. The conductive material 34 may be connected to ground and may prevent buildup of charge on the burls 30.

In an alternative embodiment (not illustrated) the electrostatic clamp shown in FIG. 7C (or that shown in FIG. 7D) may be fabricated using a process which corresponds with that described above in relation to FIG. 6. That is, a layer of dielectric may be provided, and burls may subsequently be provided on that layer of dielectric. The burls may be formed from dielectric, or may be formed from a suitable non-dielectric material. The burls may be formed from an insulator which is not a dielectric.

The dielectric used by embodiments of the invention to form the burls 10, 30 may be a material which provides sufficient wear resistance to allow the electrostatic clamp to have a useful lifetime. For example, the dielectric may be sufficiently wear resistant to allow tens of wafers (or one hundred wafers or more) to be held by and removed from the electrostatic clamp per hour, for a period of months. Diamond-like carbon (DLC) may provide sufficient wear resistance. In addition, DLC may allow polishing to desired smoothness and may maintain that smoothness over time.

The dielectric layer of embodiments of the invention could be a single dielectric. Alternatively, two or more dielectrics may be used to form the dielectric layer. For example, a layer of a second dielectric may be provided on top of a layer of a first dielectric. For example, alternating layers of first and second dielectrics (or more dielectrics) may be provided.

Where the terms "upper" or "lower" are used in the context of the electrostatic clamp, these are intended to be descriptive of the electrostatic clamp when it is in the orientation shown in the Figures. The electrostatic clamp may have any suitable orientation in use.

Although the described embodiments have referred to clamping substrates such as wafers, an electrostatic clamp according to an embodiment of the invention may be used to clamp any suitable object, including for example a mask or other patterning device.

The resistivity of the dielectric material 8, 28 may be at least two orders of magnitude greater than the resistivity of the resistive material 6. The dielectric material 8, 28 may for example have a permittivity which is between around 2 and around 5.

The height of the burls 10, 30 may be selected to allow accommodation of contamination particles of a given diameter.

Any suitable number of burls may be provided on the electrostatic clamp. The burls may for example be separated by 2.5 mm (or may have some other separation). The burls may be provided in a grid arrangement, or any other suitable arrangement.

The electrostatic clamp may have any suitable shape. The electrostatic clamp may for example be rectangular, and may thus be suitable for clamping a mask (or other rectangular object). The electrostatic clamp may for example have the general shape of a segment of a circle, and may thus be suitable for clamping a wafer (or other circular substrate). The electrostatic clamp may include more than one electrode.

In an embodiment, a channel may be provided inside the clamp through which cooling fluid such as water may be circulated.

The term "burl" as used herein may be interpreted as meaning a protrusion which is configured to receive an object to be clamped.

The term "smooth" as used herein may be interpreted as referring to a surface which is sufficiently smooth that when a layer of dielectric having a thickness of for example 10 microns is provided on the surface, pinholes are not present in the layer of dielectric (or are unlikely to be present).

The present invention may further be described by the following clauses:

1. An electrostatic clamp, comprising:
   an electrode;
   a layer of resistive material located on the electrode; and
   a layer of dielectric located on the resistive material, wherein burls project from the layer of dielectric.
2. The electrostatic clamp of clause 1, wherein the burls comprise dielectric.
3. The electrostatic clamp of clause 2, wherein the burls and the layer of dielectric comprise a same dielectric material.
4. The electrostatic clamp of clause 2, wherein the burls are formed of a first dielectric material and the layer of dielectric is formed of a second dielectric material, which is different than the first dielectric material.
5. The electrostatic clamp of clause 1, wherein a surface of the resistive material on which the layer of dielectric is provided is smooth.
6. The electrostatic clamp of clause 1, wherein a surface of the resistive material on which the layer of dielectric is provided is polished.
7. The electrostatic clamp of clause 1, wherein the burls comprise diamond-like carbon.
8. The electrostatic clamp of clause 1, wherein the layer of dielectric and the burls both comprise diamond-like carbon.
9. An electrostatic clamp, comprising:
   an electrode; and
   a layer of dielectric located on the electrode, wherein burls project from the layer of dielectric.
10. The electrostatic clamp of clause 9, wherein the burls comprise a dielectric.
11. The electrostatic clamp of clause 10, wherein the burls and the layer of dielectric material comprise the same dielectric.
12. The electrostatic clamp of clause 9, wherein a surface of the electrode on which the layer of dielectric is provided is smooth.
13. A lithographic apparatus comprising the clamp of clause 1.
14. A lithographic apparatus comprising the clamp of clause 9.
15. A method of making an electrostatic clamp, comprising:
    disposing a layer of resistive material on an electrode;
    disposing a layer of dielectric on the layer of resistive material; and
    removing some of the dielectric to form burls that project from the layer of dielectric.
16. The method of clause 15, wherein a surface of the layer of resistive material upon which the layer of dielectric is provided is smooth.
17. The method of clause 15, wherein a surface of the layer of resistive material upon which the layer of dielectric is provided is polished.
18. A method of making an electrostatic clamp, comprising:
    disposing a layer of resistive material on an electrode;
    disposing a layer of dielectric on the layer of resistive material; and
    forming burls on the layer of dielectric.
19. The method of clause 18, wherein the burls are formed from the layer of dielectric.
20. The method of clause 19, wherein the burls and the layer of dielectric comprise the same dielectric.
21. The method of clause 18, wherein a surface of the layer of resistive material upon which the layer of dielectric is provided is smooth.

22. The method of clause 18, wherein a surface of the layer of resistive material upon which the layer of dielectric is provided is polished.

23. A method of making an electrostatic clamp, comprising:
disposing a layer of dielectric on an electrode; and
removing some of the dielectric to form burls that project from the layer of dielectric material.

24. The method of clause 23, wherein a surface of the electrode on which the layer of dielectric is provided is smooth.

25. The method of clause 23, wherein a surface of the electrode on which the layer of dielectric is provided is polished.

26. A method of making an electrostatic clamp, comprising:
disposing a layer of dielectric on an electrode; and
forming burls on the layer of dielectric material.

27. The method of clause 26, wherein a surface of the electrode on which the layer of dielectric is provided is smooth.

28. The method of clause 26, wherein a surface of the electrode on which the layer of dielectric is provided is polished.

Although specific reference may be made in this text to the use an electrostatic clamp in lithographic apparatus, it should be understood that the electrostatic clamp described herein may have other applications, such as for use in mask inspection apparatus, wafer inspection apparatus, aerial image metrology apparatus and more generally in any apparatus that measure or process an object such as a wafer (or other substrate) or mask (or other patterning device) either in vacuum or in ambient (non-vacuum) conditions, such as, for example in plasma etching apparatus or deposition apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, smooth-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g., having a wavelength of or about 365, 355, 248, 193, 157 or 126 nm) and extreme ultraviolet (EUV) radiation (e.g., having a wavelength in the range of 5-20 nm), as well as beams of charged particles, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The description is not intended to limit the invention.

The invention claimed is:

1. An electrostatic clamp comprising:
an electrode;
a layer of resistive material located on the electrode, the resistive material having a volume resistivity in the range $10^7$ Ω-m to $10^9$ Ω-m; and
a layer of dielectric deposited onto the resistive material,
wherein the electrostatic clamp further comprises burls which project from the layer of dielectric.

2. The electrostatic clamp of claim 1, wherein the burls are formed from dielectric.

3. The electrostatic clamp of claim 2, wherein the burls and the layer of dielectric are both formed from a same dielectric.

4. The electrostatic clamp of claim 2, wherein the burls are formed from a dielectric which is different from the dielectric used to form the layer of dielectric.

5. The electrostatic clamp of claim 1, wherein a surface of the resistive material on which the layer of dielectric is deposited is sufficiently smooth that no pinholes will occur in a 10 micron thick layer of the dielectric.

6. The electrostatic clamp of claim 1, wherein a surface of the resistive material on which the layer of dielectric is deposited is polished.

7. The electrostatic clamp of claim 1, wherein the burls are formed from diamond-like carbon.

8. The electrostatic clamp of claim 1, wherein the layer of dielectric and the burls are both formed from diamond-like carbon.

9. A lithographic apparatus comprising the electrostatic clamp of claim 1.

10. The electrostatic clamp of claim 1, wherein the burls are formed from the layer of dielectric.

11. The electrostatic clamp of claim 1, wherein the burls are deposited on the layer of dielectric.

12. An electrostatic clamp, comprising:
an electrode; and
a layer of dielectric located on the electrode,
wherein the electrostatic clamp further comprises burls that project from the layer of dielectric,
wherein a surface of the electrode on which the layer of dielectric is provided is sufficiently smooth that no pinholes will occur in a 10 micron thick layer of the dielectric, and
wherein the layer of dielectric and the burls are both formed from diamond-like carbon.

13. A lithographic apparatus comprising the electrostatic clamp of claim 12.

14. A method of making an electrostatic clamp comprising:
- providing a layer of resistive material on top of an electrode, the resistive material having a volume resistivity in the range $10^7$ Ω-m to $10^9$ Ω-m;
- depositing a layer of dielectric onto the layer of resistive material; and
- removing some of the dielectric to form burls which project from the layer of dielectric.

15. The method of claim 14, wherein a surface of the layer of resistive material upon which the layer of dielectric is deposited is sufficiently smooth that no pinholes will occur in a 10 micron thick layer of the dielectric.

16. The method of claim 14, wherein a surface of the layer of resistive material upon which the layer of dielectric is deposited is polished.

17. A method of making an electrostatic clamp comprising:
- providing a layer of resistive material on top of an electrode, the resistive material having a volume resistivity in the range $10^7$ Ω-m to $10^9$ Ω-m;
- depositing a layer of dielectric onto the layer of resistive material; and
- forming burls on top of the layer of dielectric.

18. The method of claim 17, wherein the burls are formed from dielectric.

19. The method of claim 18, wherein the burls and the layer of dielectric are both formed using a same dielectric.

20. The method of claim 17, wherein a surface of the layer of resistive material upon which the layer of dielectric is deposited is sufficiently smooth that no pinholes will occur in a 10 micron thick layer of the dielectric.

21. The method of claim 17, wherein a surface of the layer of resistive material upon which the layer of dielectric is deposited is polished.

22. A method of making an electrostatic clamp comprising:
- providing a layer of dielectric on top of an electrode; and
- removing some of the dielectric to form burls which project from the layer of dielectric;
- wherein a surface of the electrode on which the layer of dielectric is provided is sufficiently smooth that no pinholes will occur in a 10 micron thick layer of the dielectric, and
- wherein the layer of dielectric and the burls are both formed from diamond-like carbon.

23. The method of claim 22, wherein a surface of the electrode on which the layer of dielectric is provided is polished.

24. A method of making an electrostatic clamp comprising:
- providing a layer of dielectric on top of an electrode; and
- forming burls on top of the layer of dielectric;
- wherein a surface of the electrode on which the layer of dielectric is provided is sufficiently smooth that no pinholes will occur in a 10 micron thick layer of the dielectric, and
- wherein the layer of dielectric and the buds are both formed from diamond-like carbon.

25. The method of claim 24, wherein a surface of the electrode on which the layer of dielectric is provided is polished.

* * * * *

UNITED STATES PATENT AND TRADEMARK OFFICE
CERTIFICATE OF CORRECTION

PATENT NO. : 9,939,737 B2
APPLICATION NO. : 14/761957
DATED : April 10, 2018
INVENTOR(S) : Klomp et al.

It is certified that error appears in the above-identified patent and that said Letters Patent is hereby corrected as shown below:

In the Claims

In Claim 24, Column 18, Line 26, please delete "the buds are both" and insert --the burls are both--.

Signed and Sealed this
Second Day of October, 2018

Andrei Iancu
*Director of the United States Patent and Trademark Office*